United States Patent [19]
Yasutake et al.

[11] Patent Number: 5,368,613
[45] Date of Patent: Nov. 29, 1994

[54] ELECTRON BEAM EXPOSURE APPARATUS

[75] Inventors: Nobuyuki Yasutake, Tokyo; Akio Yamada, Kawasaki, both of Japan

[73] Assignee: Fujitsu Limited, Kawasaki, Japan

[21] Appl. No.: 947,963

[22] Filed: Sep. 21, 1992

Related U.S. Application Data

[63] Continuation of Ser. No. 533,861, Jun. 6, 1990, abandoned.

[30] Foreign Application Priority Data

Jun. 7, 1989 [JP] Japan ................................. 1-144415

[51] Int. Cl.$^5$ ............................................. B21F 41/00
[52] U.S. Cl. ................................. 29/25.01; 430/942; 250/492.2
[58] Field of Search ................... 250/492.2; 29/25.01; 33/18.1; 430/942

[56] References Cited

U.S. PATENT DOCUMENTS

| | | | |
|---|---|---|---|
| 3,911,321 | 10/1975 | Wardly | 315/364 |
| 4,117,339 | 9/1978 | Wolfe | 250/492 A |
| 4,198,569 | 4/1980 | Takayama | 250/492 R |
| 4,395,691 | 7/1983 | Knauer | 335/210 |
| 4,692,579 | 9/1987 | Saitou et al. | 250/492.2 |
| 4,945,246 | 7/1990 | Davis et al. | 250/492.2 |

FOREIGN PATENT DOCUMENTS

| | | | |
|---|---|---|---|
| 0051733 | 5/1982 | European Pat. Off. | |
| 112017 | 7/1982 | Japan. | |
| 0231324 | 11/1985 | Japan | H01L 21/30 |

OTHER PUBLICATIONS

Shin-ichi Hamaguchi, Jun-ichi kai, and Hiroshi Yasuda, High-precision reticle making by electron-beam lithography, pp. 204–208.

Primary Examiner—R. Bruce Breneman
Attorney, Agent, or Firm—Staas & Halsey

[57] ABSTRACT

An electron beam exposure apparatus comprises an electron beam source, a holder for supporting a semiconductor substrate, a beam patterning part for patterning the electron beam, a beam focusing system for focusing the patterned electron beam on the semiconductor substrate, and a beam deflector system for deflecting the focused electron beam. The beam deflector comprises at least first, second and third coil assemblies connected in series for producing first through third magnetic fields respectively such that the first through third magnetic fields extend generally perpendicularly to the beam path of the electron beam at respective vertical levels on the beam path. The beam deflection means further comprises fourth and fifth coil assemblies for producing fourth and fifth magnetic fields respectively wherein the fourth coil assembly is disposed such that the fourth magnetic field extends generally parallel to the second magnetic field for correcting the second magnetic field and the fifth coil means is disposed such that the fifth magnetic field extends generally parallel to the third magnetic field for correcting the third magnetic field. Further, the electron beam exposing apparatus includes a driving system for energizing the beam deflector by driving the fourth and fifth coil assemblies independently from the first through third coils, so that the electron beam is deflected by a desired deflection angle and hits the semiconductor substrate substantially vertically at a desired location without the coma aberration.

13 Claims, 8 Drawing Sheets

ELECTRON BEAM EXPOSURE APPARATUS

This application is a continuation of application Ser. No. 07/533,861, filed Jun. 6, 1990, now abandoned.

BACKGROUND OF THE INVENTION

1. Field of the Invention

The present invention generally relates to fabrication of semiconductor devices, and in particular, to an electron beam exposure apparatus used in the fabrication of semiconductor devices.

2. Description of the Related Art

Electron beam exposure apparatuses are used in the fabrication of very large scale integrated circuits (VLSI) having an extremely large integration density because of the capability of writing semiconductor patterns with submicron- or even nanometric resolution. As the electron beam exposure apparatus in general has a relatively small throughput, efforts have been made to increase the speed of exposure such that the efficiency of the production of the integrated circuit is improved.

FIG. 1 shows a typical prior art electron beam exposure apparatus. Referring to FIG. 1, the electron beam exposure apparatus includes an electron gun 20 formed from a cathode 21, a grid 22 and an anode 23 for producing an electron beam B. The electron beam B thus produced is passed through an electron lens system including a conversion lens 25, demagnification lenses 26 and 27 and an objective lens 28 after a suitable shaping and is focused on a wafer 30 supported on a movable stage 31. Further, the electron beam B is moved over the wafer 30 by a deflector 29 to be described later. The wafer 30 is applied with an electron beam resist and in response to the irradiation of the electron beam, the part of the electron beam resist hit by the electron beam experiences a chemical reaction. Thereby, the wafer 30 is exposed according to a desired semiconductor pattern.

The semiconductor pattern may be written on the wafer 30 by moving the sharply converged electron beam over the wafer 30 or by passing the electron beam B through a stencil mask to shape the electron beam according to a desired semiconductor pattern. For this purpose, the stencil mask is formed with the semiconductor pattern to be transferred on the wafer by the electron beam. Alternatively, the electron beam B may be passed through a blanking aperture array which selectively passes the electron beam B as an electron beam B1 under a control of an external control circuit to form an array of dots on the wafer 30 by the electron beam B1. In FIG. 1, the blanking aperture array is shown schematically by a reference numeral 32. When passing through the blanking aperture array 32, a part of the electron beam B is deflected away as shown by a beam B2 and is thereby prevented from reaching the wafer 30. For this purpose, the blanking aperture array 32 has a number of deflection electrodes arranged in a row and column formation. Each of these electrodes are energized selectively under control of an external circuit. The foregoing deflector 29 may be an electromagnetic deflector using deflection coils and is provided below the lens 27.

FIG. 2 shows the deflector 29. As shown in FIG. 2, the deflector 29 includes a first coil assembly 291 made of a pair of coils 1 and 2 connected in series for creating a magnetic field Bx1 extending from the coil 1 to the coil 2 in a plane generally perpendicular to the electron beam B, and another pair of coils 3 and 4 also connected in series for creating another magnetic field By1 in a direction perpendicular to the magnetic field Bx1 such that the magnetic field By1 extends from the coil 3 to the coil 4 in a plane generally perpendicular to the electron beam B. Similarly, the deflector 29 includes a second coil assembly 292 made of a pair of coils 5 and 6 connected in series for creating a magnetic field Bx2 extending from the coil 5 to the coil 6 in a plane generally perpendicular to the electron beam B, and another pair of coils 7 and 8 also connected in series for creating another magnetic field By2 such that the magnetic field By2 extends from the coil 7 to the coil 8 in a plane generally perpendicular to the electron beam B and in a direction perpendicular to the magnetic field Bx2. It should be noted that the second coil assembly 292 is disposed closer to the wafer 30 with respect to the first coil assembly 291. Further, the deflector 29 includes a third coil assembly 293 made of a pair of coils 9 and 10 for creating a magnetic field Bx3 extending from the coil 9 to the coil 10 in a plane generally perpendicular to the electron beam B, and another pair of coils 11 and 12 for creating another magnetic field By3 in a direction perpendicular to the magnetic field Bx3 such that the magnetic field By3 extends from the coil 11 to the coil 12 in a plane generally perpendicular to the electron beam B. The third coil assembly 293 is disposed further closer to the wafer 30 with respect to the second coil assembly 292.

In response to the magnetic fields Bx1–Bx3, the electron beam B is moved over the wafer 30 in the X-direction while in response to the magnetic fields By1–By3, the electron beam B is moved over the wafer 30 in the Y-direction. Thus, by controlling the magnetic fields Bx1–Bx3 and the magnetic fields By1–By3 independently, the movement of the electron beam B on the wafer 30 is controlled in mutually perpendicular directions.

Each of the magnetic fields created by the coils 1–11 shown in FIG. 2 are substantially in a plane defined by X- and Y-axes of the coordinate system shown in FIG. 2 wherein the coordinate system has its Z-axis chosen so as to coincide substantially with the general direction of the electron beam B exiting from the electron gun 20 and reaching the wafer 30 (FIG. 1).

In operation, the coils 1 and 2 are energized simultaneously and independently from other coils, the coils 3 and 4 are energized simultaneously and independently from other coils, the coils 5 and 6 are energized simultaneously and independently from other coils, the coils 7 and 8 are energized simultaneously and independently from other coils, the coils 9 and 10 are energized simultaneously and independently from other coils, and the coils 11 and 12 are energized simultaneously and independently from other coils. As a result, the electron beam B is deflected in the X-Y plane independently in the X-direction and Y-direction.

FIG. 3 shows a drive circuit of the deflection system 29. In FIG. 3, only the connection including the coils 1 and 2, the coils 5 and 6 and the coils 9 and 10 for deflecting the electron beam in the X-direction is shown. As shown in FIG. 3, the coils 1, 2, 5, 6, 9 and 10 are connected in series and driven by a drive amplifier 41 which produces a drive current of about 2–3 amperes and about 10 volts in response to a semiconductor pattern data supplied to a deflection controller 43 which produces a digital deflection control data. The digital deflection control data is converted to an analog deflection control signal by a digital-to-analog converter 42 and in response thereto, the drive amplifier produces the drive current which is caused to flow through the coils 1, 2, 5, 6, 9 and 10. The same driving circuit is provided also for the coils 3 and 4, 7 and 8, and 11 and 12.

Each of the coils shown in FIG. 2 has a number of turns of about 5-20 and creates the foregoing magnetic field which act to deflect the electron beam B to a desired location on the wafer 30. In order to achieve the desired deflection with a satisfactory precision, the coils 1-11 are disposed with an exact geometrical relationship with each other and the drive current flowing through the coils are optimized.

In the electron beam exposure apparatus, in general, it is necessary to a) deflect the electron beam by a desired angle, b) deflect the deflected electron beam again so that the electron beam hits substantially vertically the substrate 30, and to c) minimize the coma aberration.

With respect to the foregoing point a), it is desirable and essential that a large deflection angle is obtained for an efficient exposure of the semiconductor pattern.

With respect to the foregoing point b), it should be noted that there occurs a lateral deviation in the beam spot on the top surface of the wafer if the electron beam does not hit the wafer vertically. Referring to FIG. 4 showing an example of exposure of the wafer 30 by a deflected electron beam B, it will be understood that there occurs a lateral deviation of the electron beam B of $\Delta X$ in response to the variation $\Delta H$ which is a change in the level of the wafer surface with respect to the electron beam B when the electron beam B hits the wafer 30 obliquely. As shown therein, there holds a relation $\Delta X = \Delta H \cdot \tan\alpha$ where $\alpha$ represents the deviation of incidence angle from the vertical. When the angle $\alpha$ is zero and the beam hits the wafer 30 vertically, there occurs no deviation of the beam spot even when the level or height of the wafer 30 is changed because the angle $\alpha$ is zero. In the conventional electron beam exposure apparatus used currently, however, the parameter $\tan\alpha$ usually takes a value of about 1/20. In this case, the variation of level of the wafer surface 30 of about 10 $\mu m$, which is quite common, induces a lateral variation of the electron beam B of about 0.5 $\mu m$. As it is required in the electron beam lithography that the semiconductor pattern can be written on the wafer 30 with the line width of less than about 0.5 $\mu m$ preferably less than 0.01 $\mu m$, such a displacement of the electron beam on the wafer 30 is certainly not tolerable.

The coma aberration in the foregoing point c) represents a deformation of the beam spot which cannot be compensated, unlike other aberrations, by the correction coils. In other words, this coma aberration has to be minimized by setting the relation between the coils forming the deflector 29 optimum on the basis of simulation.

In order to satisfy the foregoing points a)-c), the conventional electron beam exposure apparatus of FIG. 1 uses three coil assemblies 291-293, and the geometrical relationship as well as the drive current flowing therethrough are optimized to achieve the desired result with respect to the foregoing points a)-c). More specifically, the coils 1-4, 5-8 and 9-12 forming the coil assemblies 291-293 are adjusted with respect to their vertical positions measured along the path of the beam B as well as with respect to the direction of the magnetic field Bx1-Bx3, By1-By3 particularly the plane perpendicular to the path of the beam B.

The geometrical relationship between the coils 1-11 as well as the construction of each of these coils are determined previously to the assembling of the electron beam exposure apparatus by conducting a simulation, and the coils are manufactured and mounted according to the geometrical relationship determined by the simulation as accurately as possible so that an ideal result is achieved with respect to the foregoing points a)-c). For example, the simulation indicates that a coma aberration of about 0.005 $\mu m$ can be achieved in the ideal case.

In the actual electron beam exposure apparatus, however, such an ideal state is not achieved. In addition to the commonly occuring variation of the level $\Delta H$ of the wafer surface of about 10 $\mu m$ or more, there arises a problem of error in the mechanical setting of the coils forming the electromagnetic deflector 29. Further, there is an inevitable deviation in the number of turns of the coils forming the electromagnetic deflector as the optimized number of turns of the coils is usually given in a form of non-integer number while the actual number of turns has to be an integer.

For the foregoing reasons, one has to adjust the geometrical relationship by a trial and error process while actually writing a test pattern repeatedly on the wafer 30. Such a trial and error process includes a process of breaking the vacuum and changing the position of the coils within the apparatus by a manual adjusting process. Thus, the adjustment of the electron beam exposure apparatus is complex and requires considerable time. Although the optimization of the deflection of the electron beam may be achieved by changing the drive current independently by using independent driving system for each of the coils 1-12, such an approach needs a number of large and bulky amplifiers capable of providing a drive current of several amperes or more. Associated therewith, the power needed to drive the electromagnetic deflector increases and the cost of the driving circuit also increases steeply.

For the foregoing reasons, the conventional electron beam exposure system had the problems that the electron beam cannot be deflected accurately, the vertical incidence of the electron beam to the wafer is not achieved, and the coma aberration in the magnitude of about 0.1 $\mu m$ remains.

SUMMARY OF THE INVENTION

Accordingly, it is a general object of the present invention to provide a novel and useful electron beam exposure apparatus wherein the foregoing problems are eliminated.

Another object of the present invention is to provide an electron beam exposure apparatus wherein the deflection of the electron beam is controlled accurately by simple means.

Another object of the present invention is to provide an electron beam exposure apparatus wherein the electron beam is deflected by an exactly controlled deflection angle, is controlled to incident to a semiconductor wafer substantially vertically, and has a minimized or zero coma aberration.

Another object of the present invention is to provide an electron beam exposure apparatus having an electromagnetic deflector, the electromagnetic deflector including primary deflection means for creating a primary magnetic field for deflecting an electron beam such that the electron beam hits a wafer at a desired position determined by a deflection control data, wherein there is provided secondary deflection means for creating a secondary magnetic field. According to the present invention, the electron beam is controlled exactly such that the electron beam is deflected with an exactly controlled deflection angle, incident to the wafer vertically and is substantially free from coma aberration, by using the secondary or auxiliary deflection means in combination with a small power driving system for driving the secondary deflection means.

Other objects and further features of the present invention will become apparent from the following detailed description when read with reference to the attached drawings.

DESCRIPTION OF THE PREFERRED EMBODIMENTS

Figure 5:
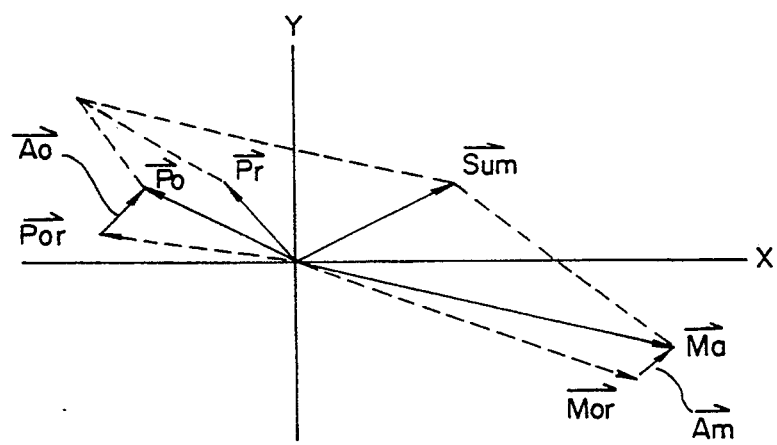
FIG. 5 is a diagram showing the principle of the present invention.

FIG. 5 shows the principle of the present invention. In the description hereinafter, it is assumed that the electron beam exposure apparatus has the general construction shown in FIG. 1 except for the details of the electromagnetic deflector 29.

Referring to FIG. 5, this drawing shows the positional vector of the electron beam B focused on the wafer 30 after the deflection by the deflector 29. In FIG. 5, the vector Pr designates the displacement of the beam spot caused by the first coil assembly 291 including the coils 1–4, the vector Por designates the displacement of the beam spot caused by the second coil assembly 292, and the vector Mor designates the displacement of the beam spot caused by the third coil assembly 293. In FIG. 5, it should be noted that all the vectors Pr, Por and Mor are on an X-Y plane coincident to the top surface of the wafer 30 and the origin of FIG. 5 coincides to the position which is hit by the undeflected electron beam B.

Figure 4:
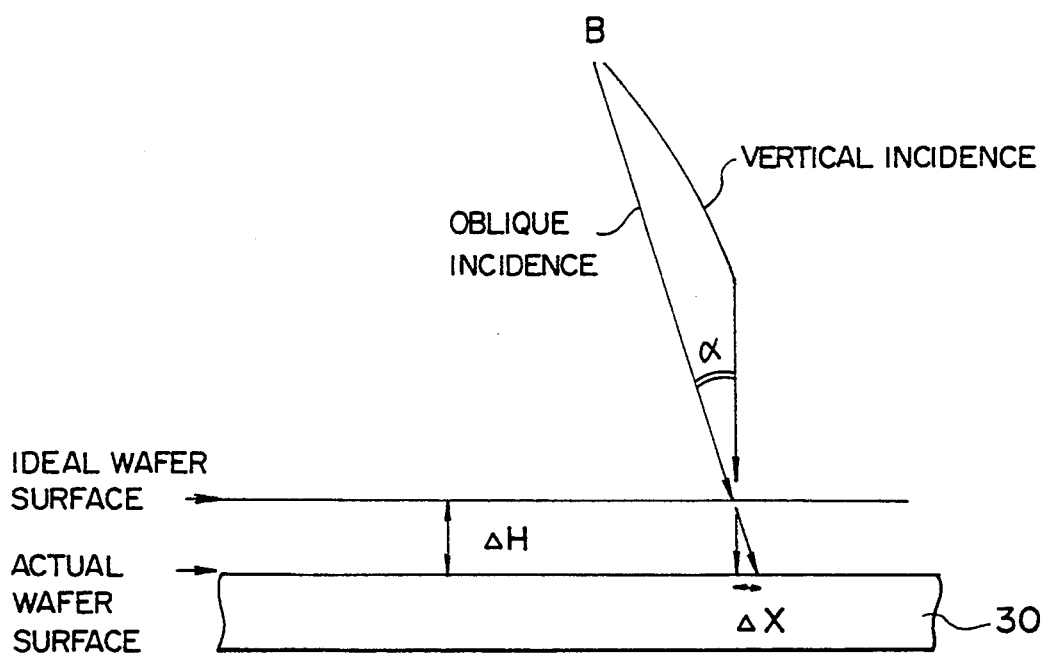
FIG. 4 is a diagram schematically showing the deflection of the electron beam and the deviation of the beam spot occuring in response to the deflection.

In FIG. 4, when it is desired to locate the beam spot of the electron beam B at a position represented by a vector Sum while satisfying the conditions wherein a large deflection angle is achieved, the vertical incidence of the electron beam to the wafer is realized and the coma aberration is eliminated, it is apparent that there needs some correction in the magnetic fields created by the coils 1–12. Note that the sum of the vectors Pr, Por and Mor does not give the vector Sum.

In the present invention, additional, auxiliary coils are provided for creating additional, auxiliary magnetic fields so that the electron beam B is deflected additionally by a vector Ao and a vector Am such that the vector Por is changed to a vector Po and the vector Mor is changed to a vector Ma. It should be noted that the vectors Pr, Po and Ma are determined by the simulation so as to optimize the deflection of the beam with respect to the position of the beam spot on the wafer, the angle of incidence to the wafer and with respect to the minimized coma aberration.

Thereby, the electron beam is deflected to the position defined by the vector Sum as a result of the sum of the vectors Pr, Po and Ma. When the vectors Por and Mor are defined generally in coincidence with the vectors Po and Ma, the deflection of the beam causing the displacement Ao and Am can be relatively small and thus, the additional coils and the driving system thereof may be designed compactly.

Figure 6B:
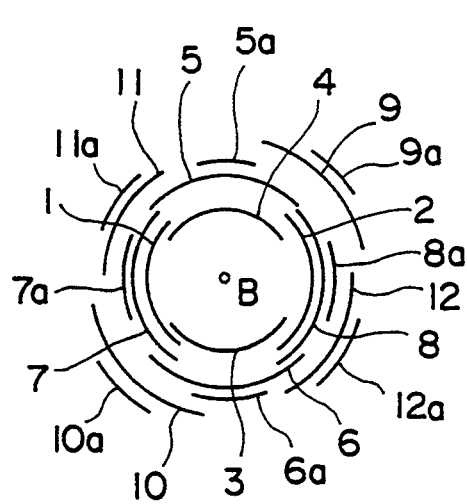
FIG. 6B is a plan view showing the electromagnetic deflector of FIG. 6A.
Figure 6A:
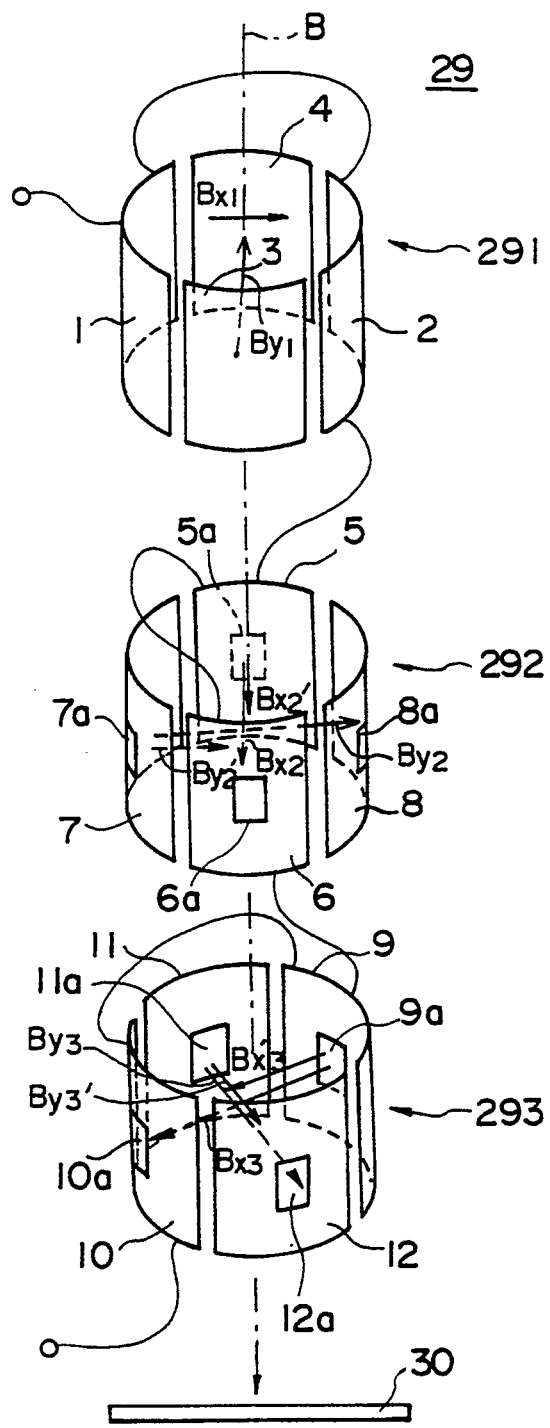
FIG. 6A is a perspective view showing a construction of the electromagnetic deflector according to a first embodiment of the present invention.

FIGS. 6A and 6B show a first embodiment which realizes the concept of FIG. 5. In the drawing, the parts constructed identically to the parts described with reference to the preceding drawings are given identical reference numerals and the description thereof will be omitted.

Referring to FIG. 6A, there are provided additional coils 5a and 6a respectively on the coils 5 and 6, additional coils 7a and 8a respectively on the coils 7 and 8, additional coils 9a and 10a respectively on the coils 9 and 10, and additional coils 11a and 12a respectively on the coils 11 and 12. Similarly to the case of the prior art electron beam exposure apparatus, the coils 1 and 2 are connected in series, the coils 3 and 4 are connected in series, the coils 5 and 6 are connected in series, the coils 7 and 8 are connected in series, the coils 9 and 10 are connected in series, and the coils 11 and 12 are connected in series. Further, the coils 1, 2, 5, 6, 9 and 10 are connected in series as shown in FIG. 6A and the coils 3, 4, 7, 8, 11 and 12 are connected in series similarly although the series connection of the coils 3, 4, 7, 8, 11 and 12 is omitted from illustration to avoid complexity of the drawings.

Similarly to the conventional apparatus, the coils 1–4 create the magnetic field Bx1 and By1 which cause the displacement of the beam B which is now represented by the vector Por, and the coils 5–8 create the magnetic field Bx2 and By2 which cause the displacement of the beam B represented by the vector Mor shown in FIG. 5.

In the present embodiment, additional coils 5a–8a are provided respectively adjacent to the coils 5–8 in generally the central part thereof for creating additional, auxiliary magnetic fields Bx2' and By2' as shown in FIG. 6A. The auxiliary coils 5a–8a are provided such that the direction of the auxiliary magnetic field Bx2' substantially coincides to the direction of the magnetic field Bx2 created by the coils 5 and 6 and such that the direction of the auxiliary magnetic field By2' substantially coincides the direction of the magnetic field By created by the coils 7 and 8. In one example, the auxiliary coils 5a–8a may be provided such that the center of the magnetic field Bx2' coincides substantially with the center of the magnetic field Bx2 and the center of the magnetic field By2' coincides substantially with the center of the magnetic field By2. However, this requirement is not essential and the coils 5a–8a may be offset upwards or downwards or to the left or to the right with respect to the coils 5–8. These magnetic fields Bx2' and By2' eventually cause the displacement of the electron beam B represented by the vector Ao.

Similarly, additional coils 9a–12a are provided respectively adjacent to the coils 9–12 for creating additional, auxiliary magnetic fields Bx3' and By3' shown in FIG. 6A. Similarly to the case of the coils 5a–8a, the coils 9a–12a are provided such that the direction of the magnetic field Bx3' coincides with the direction of the magnetic field Bx3 and the direction of the magnetic field By3' coincides with the direction of the magnetic field By3. The coils 9a–12a may be provided such that the center of the magnetic field Bx3' coincides with the center of the magnetic field Bx3 and the center of the magnetic field By3' coincides with the center of the magnetic field By3 similarly to the case of the coils 5a–8a. However, this condition is not essential and the coils 9a–12a may be offset upwards or downwards or to the right or to the left with respect to the center of the coils 9–12.

As the setup of the coils 1–12 is already made at the time of assembling the electron beam exposure apparatus so that approximately the ideal deflection of the electron beam B is obtained, the magnetic fields Bx1'–Bx3' and the magnetic fields By1'–By3' may have a small strength and because of this, it is sufficient that each of the coils 5a–12a has several turns or less.

FIG. 6B shows the arrangement of the coils shown in FIG. 6A including the additional coils 5a–12a in a plan view. As can be seen from FIG. 6B, the coils are arranged concentrically about the electron beam B passing vertically to the plane of FIG. 6B, wherein the additional coil 5a and 6a are provided slightly offset to the radially outward direction with respect to the coils 5 and 6 respectively, the coils 7a and 8a are provided slightly offset to the radially outward direction with respect to the coils 7 and 8 respectively, the coils 9a and 10a are provided slightly offset to the radially outward direction with respect to the coils 9 and 10 respectively, and the coils 11a and 12a are provided slightly offset to the radially outward direction with respect to the coils 11 and 12.

Figure 7:
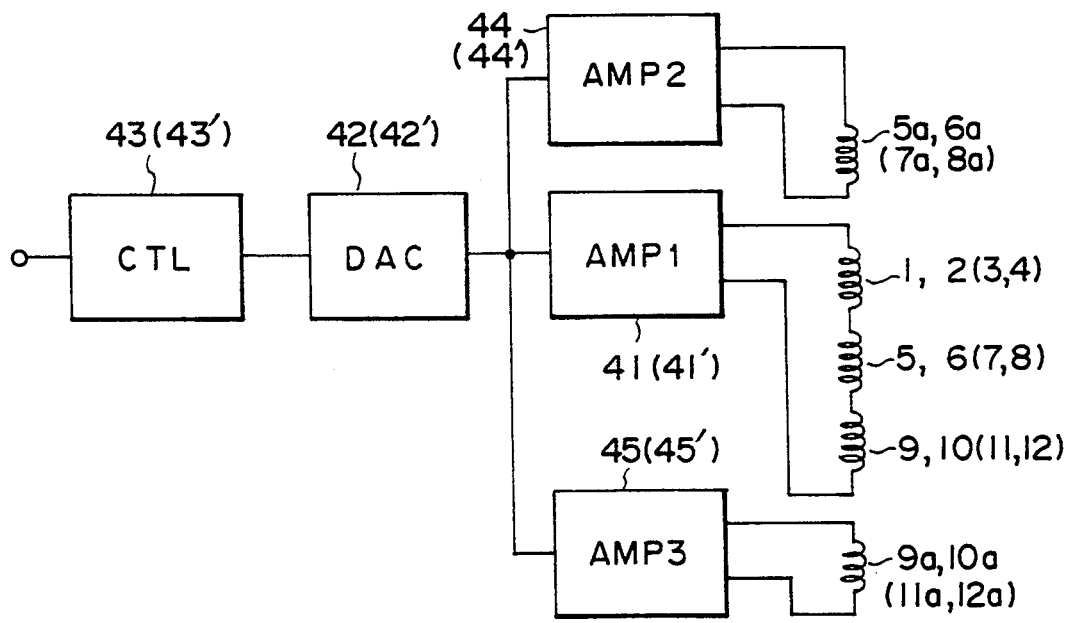
FIG. 7 is a block diagram showing a driving circuit of the electromagnetic deflector of FIG. 6.

FIG. 7 shows an example of the driving circuit used in combination with the electromagnetic deflector 29 shown in FIG. 6A. In FIG. 7, the parts already described with reference to preceding drawings are given identical reference numerals and the description thereof will be omitted.

Referring to FIG. 7, the semiconductor pattern data is supplied to the deflection controller 43 which produces the deflection control data in the X-direction and Y-direction similarly to the foregoing conventional apparatus, and these deflection control data are converted to the deflection control signals by the digital-to-analog converter 42. In the construction of the driving circuit of FIG. 6, the deflection control signal produced by the digital-to-analog converter 42 for deflecting the electron beam B in the X-direction is supplied on the one hand to the amplifier 41 similarly to the conventional apparatus, and on the other hand to an amplifier 44 which drives the coils 5a and 6a and further to an amplifier 45 which drives the coils 9a and 10a.

As already described, the coils 5a and 6a are connected in series and produce the additional magnetic fields Bx2' and By2' respectively. As the required magnitude of the magnetic fields Bx2' and By2' is small, the drive current flowing through the coils 5a and 6a may have the magnitude of a few hundred milliamperes (200–300 mA) and in correspondence to this, the driving power of the amplifier 44 may be small. Similarly, the amplifier 45 connected to the coils 9a and 10a may have a small driving power capable of providing only a few hundred milliamperes (200–300 mA) in correspondence to the relatively small magnitude of the magnetic fields Bx3' and By3'. In a typical example, the voltage of the deflection control signal is chosen to be about 10 volts.

An identical circuit construction is provided also for the deflection of the electron beam B in the Y-direction. In the driving circuit for this Y-deflection system, a deflection controller 43' is provided in correspondence to the controller 43, a digital-to-analog converter 42' is provided in correspondence to the digital-to-analog converter 42, and amplifiers 41', 44' and 45' are provided respectively in correspondence to the amplifiers 41, 44 and 45. As the construction and operation of this Y-deflection system is identical to the foregoing X-deflection system, further description of the Y-deflection system will be omitted.

In the present invention, the coarse adjustment for achieving the desired deflection, desired vertical incidence and the minimized coma aberration, is achieved similarly to the conventional electron beam exposure apparatus by driving the first through third coil assemblies 291–293 by flowing a drive current having a magnitude determined by the simulation. Further, the problem of deviation of the deflection angle from the desired deflection angle, the problem of deviation of the electron beam from the vertical incidence to the wafer, and the problem of not entirely minimized coma aberration are successfully eliminated by providing the auxiliary coils 5a–12a. For example, the parameter tanα of FIG. 4 indicating the deviation from the vertical incidence of the electron beam can be reduced to about 1/1000 or less. When this condition is satisfied, the lateral displacement of the beam spot due to the variation of the level of the wafer surface can be reduced to about 0.01 $\mu$m or less. Further, the coma aberration can be reduced below about 0.01 $\mu$m.

As the adjustment made by the auxiliary coils 5a–12a is minute, the size and number of turns of the auxiliary coils may be small. In correspondence thereto, one can use a compact driving system particularly the driving amplifiers 44 and 45 or 44' and 45' for energizing the auxiliary coils. Thereby, the setup of the electron beam exposure system can be made efficiently and the efficiency of production of the semiconductor device is improved.

Figure 8:
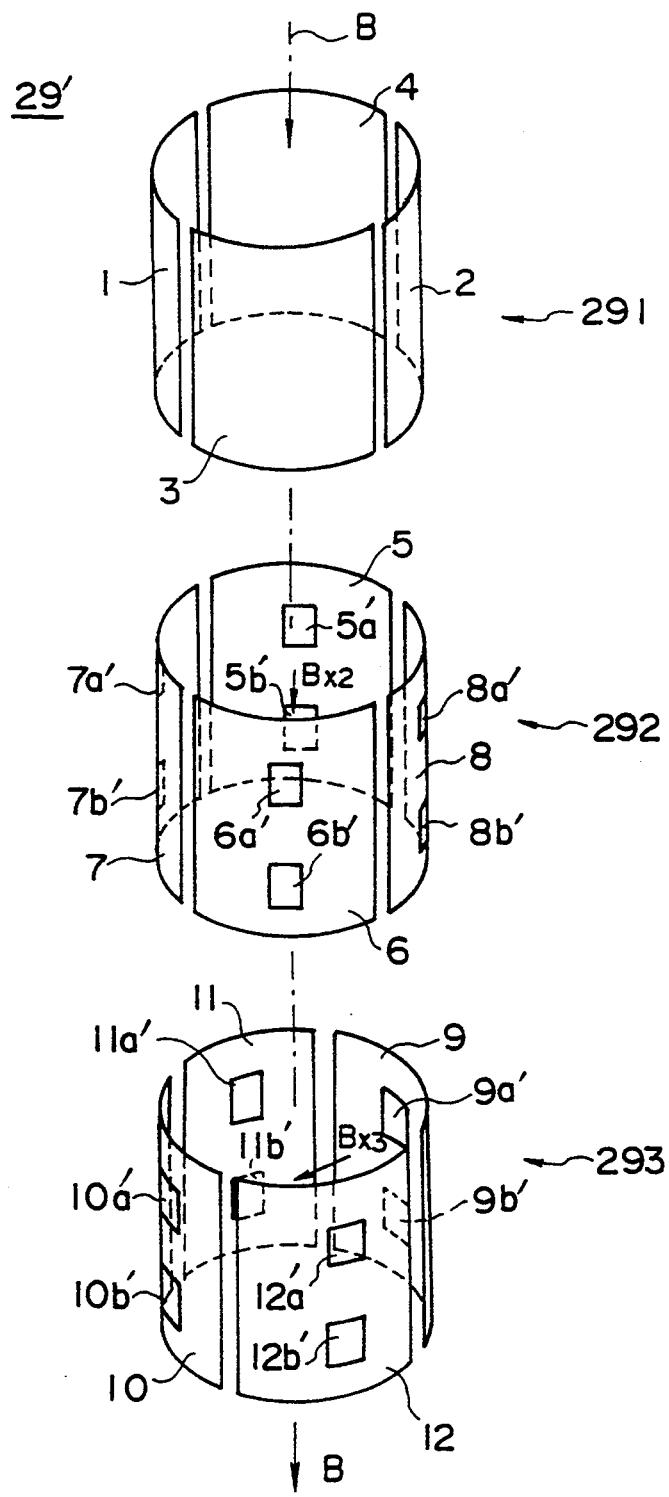
FIG. 8 is a perspective view showing the electromagnetic deflector according to a second embodiment of the present invention.

FIG. 8 shows a construction of an electromagnetic deflector 29' according to a second embodiment of the electron beam exposure apparatus of the present invention. In FIG. 8, the parts described previously with reference to preceding drawings are given identical reference numerals and the description thereof will be omitted.

In this embodiment, four pairs of auxiliary coils are provided in each of the coil assemblies 292 and 293. Thus, in the coil assembly 292, there are auxiliary coils 5a' and 5b' provided so as to be offset in the radially outward direction with respect to the coil 5 similarly to the coil 5a of FIG. 5B such that the coil 5a' is located relatively closer to the beam source of the electron beam B, i.e. the electron gun 20, and the coil 5b' is located relatively closer to the wafer 30 (see FIG. 1). Further, there are auxiliary coils 6a' and 6b' provided so as to be offset in the radially outward direction with respect to the coil 6 similarly to the coil 6a shown in FIG. 6B such that the coil 6a' is located relatively closer to the beam source of the electron beam B in a manner so as to oppose the auxiliary coil 5a' with respect to the electron beam B, and such that the coil 6b' is located relatively closer to the wafer 30 in a manner so as to oppose the auxiliary coil 5b' with respect to the electron beam B. Similarly, there are provided auxiliary coils 7a', 7b', 8a' and 8b' such that the coils 7a' and 7b' are provided so as to be offset in the radially outward direction with respect to the coil 7 similarly to the coil 7a as shown in FIG. 6B, with the coil 7a' located relatively closer to the beam source of the electron beam B and the coil 7b' located relatively closer to the wafer 30, and such that the coils 8a' and 8b' are provided so as to be offset in the radially outward direction with respect to the coil 8 similarly to the coil 8a shown in FIG. 6B, with the coil 8a' located relatively closer to the beam source of the electron beam B and the coil 8b' located relatively closer to the wafer 30. The coils 7a' and 8a' oppose with each other and the coils 7b' and 8b' oppose with each other with respect to the electron beam B similarly to the coils 5a', 6a', 5b' and 6b'.

Figure 1:
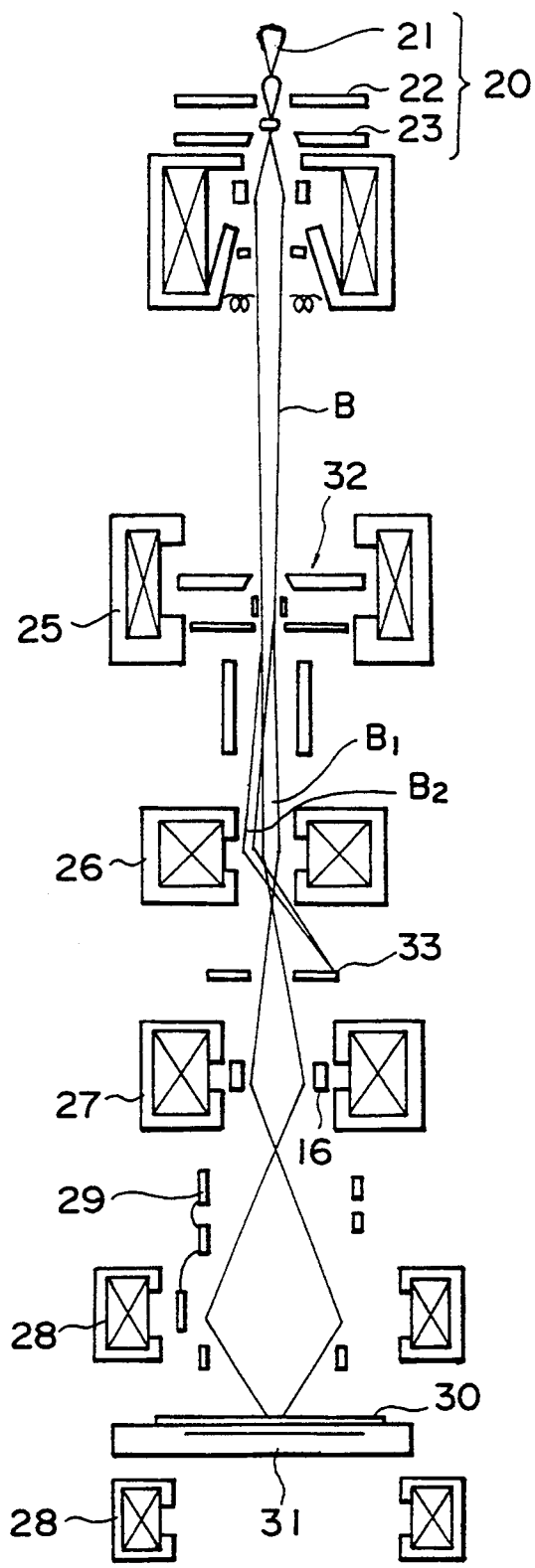
FIG. 1 is a diagram showing schematically the construction of a conventional electron beam exposure apparatus.
Figure 2:
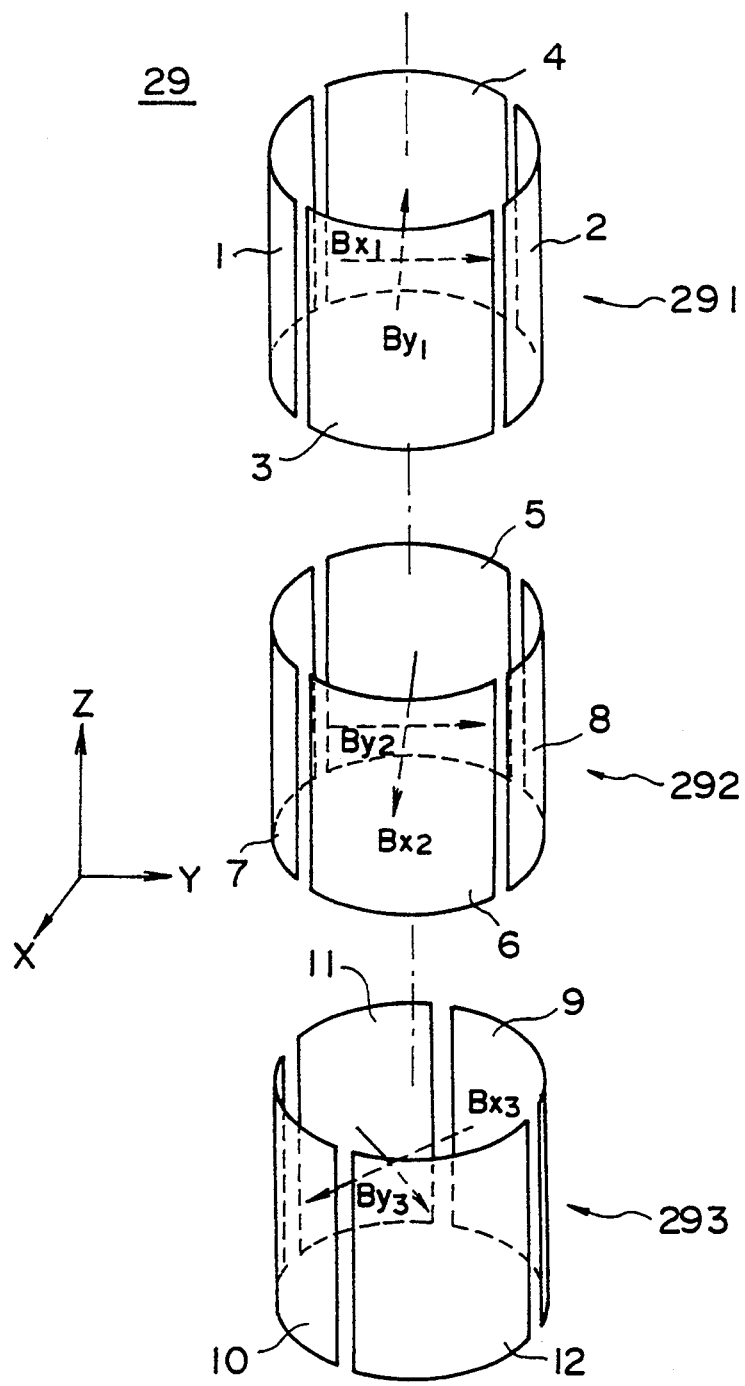
FIG. 2 is a schematical perspective view showing the construction of the electromagnetic deflector used in the apparatus of FIG. 1.

In the coil assembly 293, there are auxiliary coils 9a' and 9b' provided so as to be offset in the radially outward direction with respect to the coil 9 similarly to the coil 9a of FIG. 6B such that the coil 9a' is located relatively closer to the beam source of the electron beam B i.e. the electron gun 20 and the coil 9b' is located relatively closer to the wafer 30 (see FIG. 1). Further, there are auxiliary coils 10a' and 10b' provided so as to be offset in the radially outward direction with respect to the coil 10 similarly to the coil 6a shown in FIG. 6B such that the coil 10a' is located relatively closer to the beam source of the electron beam B in a manner so as to oppose the auxiliary coil 10a' with respect to the electron beam B, and such that the coil 10b' is located relatively closer to the wafer 30 in a manner so as to oppose the auxiliary coil 10a' with respect to the electron beam B. Similarly, there are provided auxiliary coils 11a', 11b', 12a' and 12b' such that the coils 11a' and 11b' are provided so as to be offset in the radially outward direction with respect to the coil 11 similarly to the coil 11a as shown in FIG. 6B, with the coil 11a' locating relatively closer to the beam source of the electron beam B and the coil 11b' locating relatively closer to the wafer 30, and such that the coils 12a' and 12b' are provided so as to be offset in the radially outward direction with respect to the coil 12 similarly to the coil 12a shown in FIG. 6B, with the coil 12a' locating relatively closer to the beam source of the electron beam B and the coil 12b' locating relatively closer to the wafer 30. Further, the coils 9a' and 10a' oppose with each other, the coils 9b' and 10b' oppose with each other, the coils 11a' and 12a' oppose with each other, and the coils 11b' and 12b' oppose with each other with respect to the electron beam B.

Figure 9:
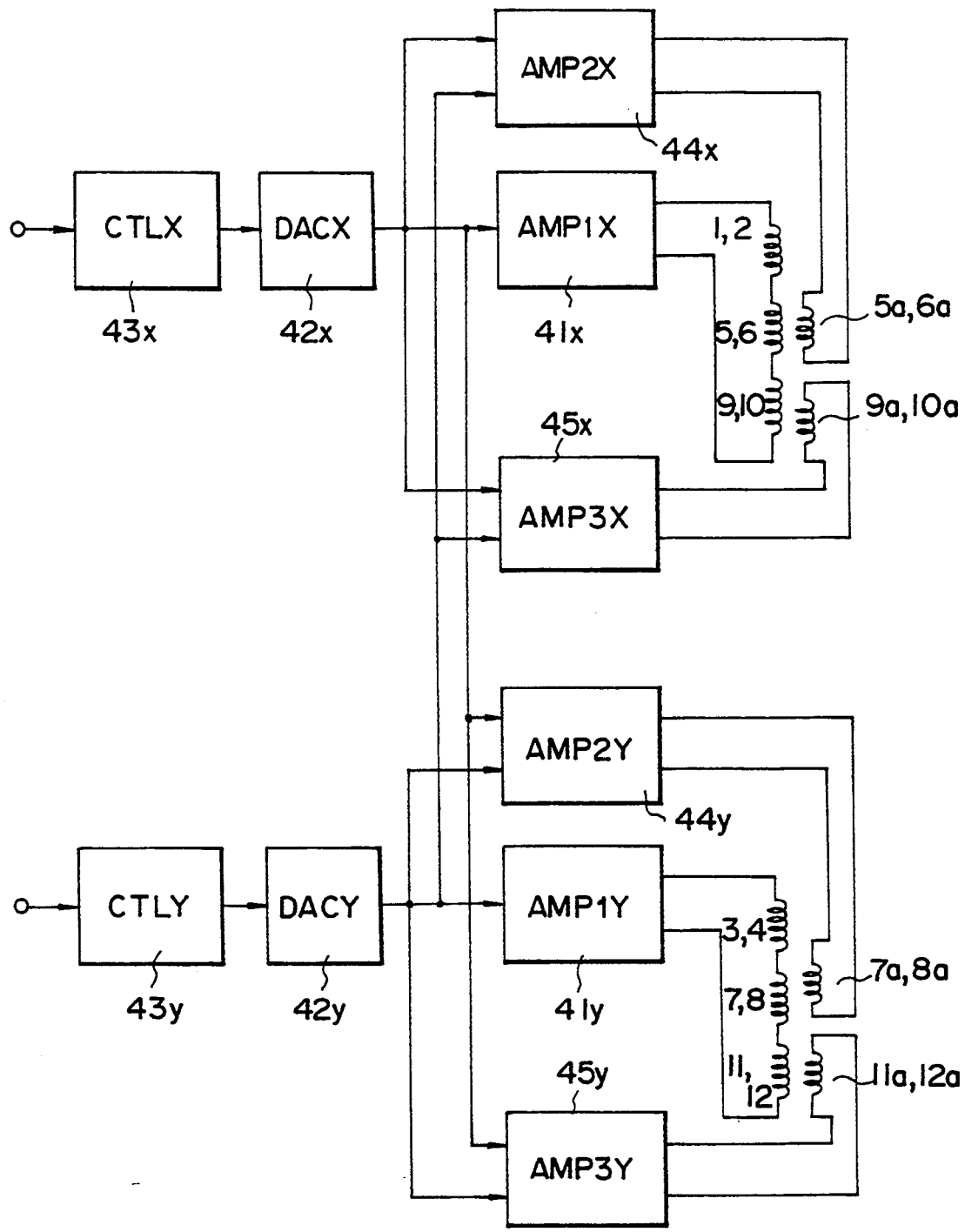
FIG. 9 is a block diagram showing a driving circuit of the electromagnetic deflector of FIG. 8.

FIG. 9 shows a driving circuit of the electron magnetic deflector 29.

Figure 3:
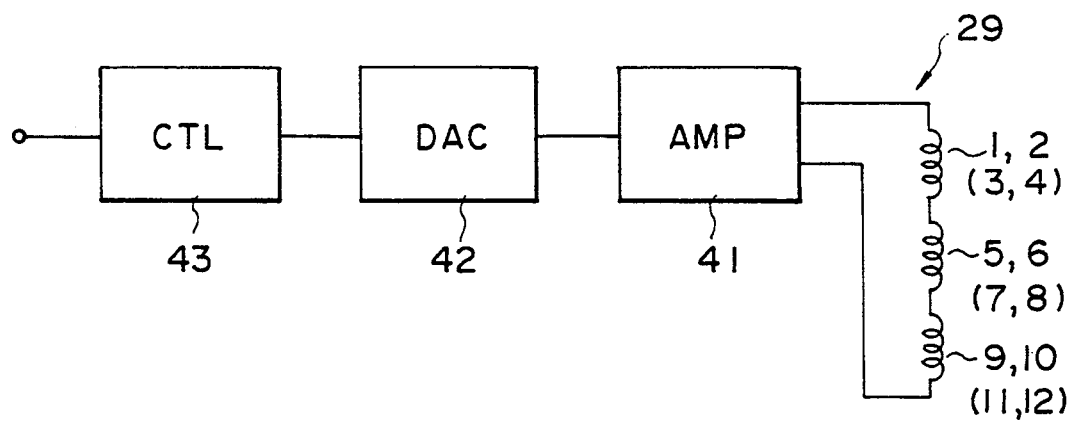
FIG. 3 is a block diagram showing the construction of a driving circuit for driving the electromagnetic deflector of FIG. 2.

Referring to FIG. 9, the driving circuit comprises a first deflection controller 43x supplied with a semiconductor pattern data for producing a first deflection control data which specifies the deflection of the electron beam in the X-direction. The deflection control data is then converted by a digital-to-analog converter 42x into an analog deflection control signal, and this analog deflection control signal is supplied to a first main drive amplifier 41x to which the coils 1, 2, 5, 6, 9 and 10 are connected in series. This part of the connection is identical to the prior art connection shown in FIG. 3. Further, the analog deflection control signal is supplied to a first auxiliary drive amplifier 44x to which the auxiliary coils 5a and 6a are connected in series and a second auxiliary drive amplifier 45x to which the auxiliary coils 9a and 10a are connected in series.

Further, there is provided a second deflection controller 43y supplied with the semiconductor pattern data for producing a second deflection control data which specifies the deflection of the electron beam in the Y-direction. The second deflection control data is converted by a digital-to-analog converter 42y into a second analog deflection control signal which is supplied on the one hand to a second main drive amplifier 41y and on the other hand to third and fourth drive amplifies 44y and 45y. To the second main amplifier 41y, the coils 3, 4, 7, 8, 11 and 12 are connected in series in correspondence to the prior art connection shown in FIG. 3. On the other hand, the third auxiliary drive amplifier 44y has its output connected to a series connection of the coil 7a and 8a and the fourth auxiliary drive amplifier 45y has its output connected to a series connection of the coils 11a and 12a.

Further, the first and second auxiliary drive amplifiers 44x and 45x are supplied with the second deflection control signal from the second digital-to-analog converter 42y. Similarly, the third and fourth auxiliary drive amplifiers 44y and 45y are supplied with the first deflection control signal from the first digital-to-analog converter 42x.

In response to the energization by the drive currents, the auxiliary coils 5a'–12a' create respective auxiliary magnetic fields such that the direction of each of the created auxiliary magnetic fields coincides with the direction of the magnetic fields created by the coils 5–12. More specifically, the magnetic field created by the coils 5a' and 6a' enhances the magnetic filed Bx2 created by the coils 5 and 6 at the upper part thereof and thereby there is obtained an effect as if the coils 5 and 6 are displaced upwards as a whole towards the beam source 20. Similarly when the auxiliary coils 5b' and 6b' are energized, the magnetic filed Bx2 is enhanced in correspondence to the lower part thereof and thereby there is obtained an effect as if the coils 5 and 6 are displaced downwards as a whole towards the wafer 30 held on the stage 31. The effect of enhancing the magnetic field Bx2 in correspondence to the lower part thereof may also be achieved by reversing the direction of the drive current flowing through the coils 5a' and 6a'. Similarly, the effect of enhancing the magnetic field Bx2 in correspondence to the upper part thereof may also be achieved by reversing the direction of the drive current flowing through the coils 5b' and 6b'.

A similar effect is obtained also for the magnetic field By2 created by the coils 7 and 8. Thus, the magnetic field created by the coils 7a' and 8a' enhances the magnetic filed By2 created by the coils 7 and 8 at the upper part thereof and thereby there is obtained an effect as if the coils 7 and 8 are displaced upwards as a whole towards the beam source 20. Similarly when the auxiliary coils 7b' and 8b' are energized, the magnetic filed By2 is enhanced in correspondence to the lower part thereof and thereby there is obtained an effect as if the coils 7 and 8 are displaced downwards as a whole towards the wafer 30 held on the stage 31. The effect of enhancing the magnetic field By2 in correspondence to the lower part thereof may also be achieved by reversing the direction of the drive current flowing through the coils 7a' and 8a'. Similarly, the effect of enhancing the magnetic field By2 in correspondence to the upper part thereof may also be achieved by reversing the direction of the drive current flowing through the coils 7b' and 8b'.

As the effect of the coils 9a'-12b' is substantially identical to the one described above, further description with regard to the effect of energization of the coils 9a'-12b' will be omitted.

Similarly to the first embodiment, an effective compensation of deviation of the magnetic field as schematically illustrated in FIG. 5 is achieved by the construction of FIG. 9.

Figure 10:
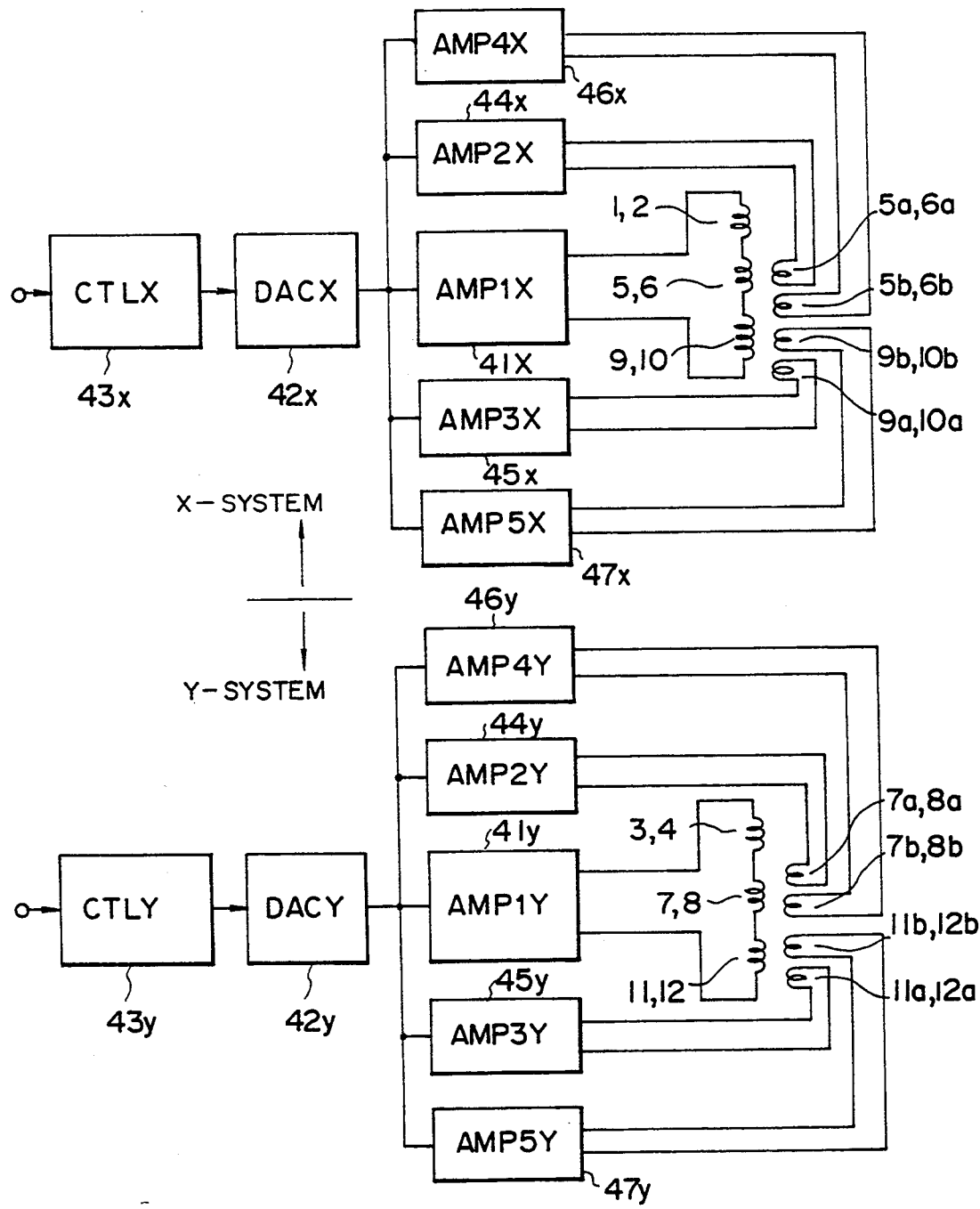
FIG. 10 is a block diagram showing another driving circuit of the electromagnetic deflector of FIG. 8.

FIG. 10 shows another driving circuit used in cooperation with the electromagnetic deflector 29' of FIG. 8. In this circuit, the auxiliary coils 5a and 6a connected in series are driven by the amplifier 44x while the auxiliary coils 5b and 6b connected in series are driven by an amplifier 46x, wherein each of the amplifiers 44x and 46x is connected in parallel to the digital-to-analog converter 42x for receiving the deflection control signal specifying the deflection of the electron beam B in the X-direction.

Further, the auxiliary coils 9a and 10a connected in series are driven by the amplifier 45x while the auxiliary coils 9b and 10b connected in series are driven by an amplifier 47x, wherein each of the amplifiers 45x and 47x is connected in parallel to the digital-to-analog converter 42x for receiving the deflection control signal specifying the deflection of the electron beam B in the X-direction.

Similarly, the auxiliary coils 7a and 8a connected in series are driven by the amplifier 44y while the auxiliary coils 7b and 8b connected in series are driven by an amplifier 46y, wherein each of the amplifiers 44y and 46y is connected in parallel to the digital-to-analog converter 42y for receiving the deflection control signal specifying the deflection of the electron beam B in the Y-direction. Further, the auxiliary coils 11a and 12a connected in series are driven by the amplifier 45y while the auxiliary coils 11b and 12b connected in series are driven by an amplifier 47y, wherein each of the amplifiers 45y and 47y is connected in parallel to the digital-to-analog converter 42y for receiving the deflection control signal specifying the deflection of the electron beam B in the Y-direction. In this construction, too, the deviation of deflection of the electron beam B from the ideal deflection is compensated effectively. Similarly to the first embodiment, the number of turns of the auxiliary coils 5a-12b may be only several turns and the driving current for creating the compensating magnetic field may be several hundred milliamperes.

Further, the present invention is not limited to the embodiments described heretofore but various variations and modifications may be made without departing from the scope of the invention.

What is claimed is:

1. An electron beam exposure apparatus for writing a pattern on a substrate with an electron beam, comprising:
    electron beam source means for producing an electron beam along a beam path extending to the substrate;
    beam patterning means for interrupting the beam path and selectively passing the electron beam therethrough, the electron beam passed through the beam patterning means having a cross-section corresponding to a desired pattern to be written on the substrate;
    beam focusing means for focusing the electron beam passed through the beam patterning means onto the substrate;
    beam deflection means for deflecting the focused electron beam in response to an energization such that the focused electron beam moves over the substrate, said beam deflection means including—
    at least first, second and third coil means connected in series for producing first, second and third magnetic fields, respectively, each having a magnitude, said first coil means being disposed such that the first magnetic field extends generally perpendicularly to the beam path of the electron beam at a first vertical position on the beam path, said second coil means being disposed such that the second magnetic field extends generally perpendicularly to the beam path at a second vertical position different from the first vertical position, said third coil means being disposed such that the third magnetic field extends generally perpendicularly to the beam path at a third vertical position different from the first and second vertical positions, said first, second and third coil means being disposed with first, second and third angular positions respectively such that the first magnetic field and the second magnetic field intersect with each other with a first angle when viewed in a direction of the beam path and such that the second magnetic field and the third magnetic field intersect with each other with a second angle when viewed in the direction of the beam path; and
    fourth coil means, including first and second coils opposing each other across the beam path, for producing a fourth magnetic field extending from said first coil to said second coil, said fourth coil means disposed such that the fourth magnetic field extends generally parallel to the second magnetic field for correcting the second magnetic field;
    fifth coil means, including third and fourth coils opposing each other across the beam path, for producing a fifth magnetic field extending from said third coil to said fourth coil, said fifth coil means disposed such that the fifth magnetic field extends generally parallel to the third magnetic field for correcting the third magnetic field, said fourth and fifth coil means producing fourth and fifth magnetic fields with a magnitude substantially smaller than the magnitude of the first, second and third magnetic fields; and
    driving means for energizing the beam deflection means by driving the first, second and third coil means and by driving the fourth and fifth coil means independently from the first, second and third coil means such that the fourth magnetic field and the fifth magnetic field are formed independently from each other and independently from the first, second and third magnetic fields, the electron beam being thereby deflected by a desired deflection angle and irradiating the substrate substantially vertically at a desired location without aberrations.

2. An electron beam exposure apparatus as claimed in claim 1, wherein said first coil and said second coil are provided radially outside of the second coil means with respect to the beam path to oppose each other, and wherein said third coil and said fourth coil are provided radially outside of the third coil means with respect to the beam path to oppose each other.

3. An electron beam exposure apparatus as claimed in claim 2, wherein said first and second coils forming the fourth coil means are provided such that the first and second coils are located at a central part of the second coil means when measured along the beam path, and wherein said third and fourth coils forming the fifth coil means are provided such that the third and fourth coils are located at a central part of the third coil means when measured along the beam path.

4. An electron beam exposure apparatus as claimed in claim 2, wherein said fourth coil means further comprises a fifth coil and a sixth coil provided radially outside of the second coil means with respect to the beam path, said fifth and sixth coil facing each other and located at a vertical position relatively closer to the substrate than the first and second coils, and said fifth coil means further comprises a seventh coil and an eighth coil provided radially outside of the third coil means with respect to the beam path, said seventh and eighth coils facing each other and located at a vertical position relatively closer to the substrate than the third and fourth coils.

5. An electron beam exposure apparatus as claimed in claim 2, wherein said first and second coils are connected in series, said third and fourth coils are connected in series, and wherein said driving system comprises a first amplifier for driving the first and second coils by supplying a first auxiliary driving current thereto and a second amplifier for driving the third and fourth coils by supplying a second auxiliary second driving current thereto.

6. An electron beam exposure apparatus as claimed in claim 4, wherein said first and second coils are connected in series, said third and fourth coils are connected in series, said fifth and sixth coils are connected in series, and said seventh and eighth coils are connected in series, and wherein said driving system comprises a first amplifier for driving the first and second coils, a second amplifier for driving the third and fourth coils, a third amplifier for driving the fifth and sixth coils and a fourth amplifier for driving the seventh and eighth coils, said driving system driving the first second, third, fourth, fifth, sixth, seventh and eighth coils such that the magnetic fields produced by the second and third coil means are moved to and from the substrate along the beam path of the electron beam.

7. An electron beam exposure apparatus as claimed in claim 4, wherein each of said first, second, third, fourth, fifth, sixth, seventh and eighth coils is driven independently by the driving system.

8. An electron beam exposure system as claimed in claim 2, wherein said first and second coils forming the fourth coil means have a number of turns which is substantially smaller than the number of turns of coils forming the first, second and third coil means, and said third and fourth coils forming the fifth coil means have a number of turns which is substantially smaller than the number of turns forming the first through third coil means.

9. An electron beam exposure apparatus for writing a pattern on a substrate with an electron beam, comprising:

electron beam source means for producing an electron beam along a predetermined beam path extending to the substrate;

beam patterning means provided so as to interrupt the electron beam path for selectively passing the electron beam therethrough, the electron beam passed through the beam patterning means having a cross-section corresponding to a desired pattern to be written onto the substrate;

beam focusing means for focusing the electron beam passed through the beam patterning means on the substrate;

beam deflection means for deflecting the focused electron beam in response to an energization such that the focused electron beam moves over the substrate;

said beam deflection means comprising at least first and second coil means connected in series for producing first and second magnetic fields respectively, said first coil means being disposed such that the first magnetic field extends generally perpendicularly to the beam path of the electron beam at a first vertical position on the beam path, said second coil means being disposed such that the second magnetic field extends generally perpendicularly to the beam path at a second vertical position different from the first vertical position, said first and second coil means being disposed with respective angular positions such that the first magnetic field and the second magnetic field intersect with each other with a predetermined angle when viewed in a direction of the beam path;

said beam deflection means further comprising a third pair of coil means for producing a third magnetic field respectively wherein said third coil means is disposed such that the third magnetic field extends generally parallel to the first magnetic field for correcting the first magnetic field, a magnitude of the third magnetic field being smaller than a magnitude of the first and second magnetic fields; and a driving system for energizing the beam deflection means by driving the first and second coil means and by driving the third coil means independently from the first and second coil means, so that the electron beam is deflected by a desired deflection angle and hits the substrate substantially vertically at a desired location without aberrations.

10. An electron beam exposure apparatus for writing a pattern on a substrate, comprising:

an electron gun providing an electron beam along a predetermined optical axis, said predetermined optical axis extending from said electron gun to said substrate;

a lens system shaping and focusing the electron beam on the substrate;

first coils disposed about the electron beam and influencing the electron beam with first magnetic fields perpendicular to the electron beam, said first coils comprising at least two different pairs of coils disposed at different vertical positions from each other, along the optical axis and connected in series with each other;

second coils, disposed about the electron beam and adjusting the electron beam by applying at least one second magnetic field to influence the first magnetic fields, said second coils comprising at least one pair of coils, a magnitude of the at least one second magnetic field being smaller than a magnitude of the first magnetic fields; and
control means for energizing said first coils and said second coils independently.

11. An electron beam exposure apparatus according to claim 10, wherein said control means energizes said first coils and said second coils to deflect the electron beam by a desired deflection angle.

12. An electron beam exposure apparatus according to claim 10, wherein said control means energizes said first coils and said second coils to thereby control the electron beam so that the electron beam hits the substrate substantially vertically at a desired location.

13. An electron beam exposure apparatus according to claim 10, wherein said control means energizes said first coils and said second coils to eliminate aberrations within the electron beam.

* * * * *